United States Patent [19]

Vinkovic et al.

[11] 4,075,015

[45] Feb. 21, 1978

[54] LIGHT SENSITIVE MASS AND PROCESS FOR ITS PRODUCTION

[75] Inventors: Josef Vinkovic, Tagerwilen; Eugen Werner, Kreuzligen, both of Switzerland

[73] Assignee: Swiss Aluminium Ltd., Chippis, Switzerland

[21] Appl. No.: 714,896

[22] Filed: Aug. 16, 1976

[30] Foreign Application Priority Data

Aug. 14, 1975 Switzerland ............... 010576/75

[51] Int. Cl.² .................. G03C 5/00; G03C 1/52; G03C 1/58

[52] U.S. Cl. .................... 96/35.1; 96/36.2; 96/36; 96/33; 96/48 R; 96/49; 96/91 R; 96/91 N; 96/115 R

[58] Field of Search .............. 96/33, 36.2, 35.1, 36, 96/91 R, 115 R, 75, 48 R, 49, 91 N

[56] References Cited

U.S. PATENT DOCUMENTS

| 3,529,965 | 9/1970 | Roell | 96/91 R |
|---|---|---|---|
| 3,926,638 | 12/1975 | Rosen et al. | 96/115 R |

Primary Examiner—Won H. Louie, Jr.
Attorney, Agent, or Firm—Virgil H. Marsh

[57] ABSTRACT

A light sensitive mass which contains a film former, which consists of 20 to 90 percent by weight of a vinyl-pyrrolidone-vinyl acetate copolymer or a polyvinyl pyrrolidone or both and 10 to 80 percent by weight of an aryl sulfone amide formaldehyde resin, and at least one sensitizer, the weight ratio of said film former to sensitizer being between 1:1 and 10:1. Usually the light sensitive mass is used as a light sensitive reversal-development layer on a carrier.

28 Claims, No Drawings

LIGHT SENSITIVE MASS AND PROCESS FOR ITS PRODUCTION

BACKGROUND OF THIS INVENTION

1. Field of This Invention

This invention relates to a process for the production of a light-sensitive mass in the form of a light-sensitive reversal-development layer on a carrier. This invention also relates to such a light sensitive mass.

2. Prior Art

Carriers with light-sensitive reversal-development layers thereon are known. The known light-sensitive masses are used in the form of aqueous solutions. Great quantities of energy and long drying times are required in order to evaporate the water and to dry such light-sensitive masses on carriers.

BROAD DESCRIPTION OF THIS INVENTION

An object of this invention is to provide a light sensitive mass for reversal-development layers of lacquers that does not have to be dissolved in water. Another object is to provide such a light sensitive mass in the form of a light sensitive reversal-development layer on a carrier. A further object of this invention is to provide a process for preparing such light sensitive masses. Other objects and advantages are stated herein or are obvious herefrom to one ordinarily skilled in the art.

The objects and advantages of this invention are achieved by the process and product of this invention.

This invention involves a light-sensitive mass which contains (a) a film former, of 20 to 90 percent weight of a vinyl pyrrolidone-vinyl acetate copolymer and/or 90 to 10 percent by weight of poly-vinyl pyrrolidone and 10 to 80 percent by weight of an aryl-sulfonamide formaldehyde resin, and (b) at least one sensitizer, the weight ratio of the film former to the sensitizer being between 1:1 and 10:1. Preferably the light sensitive mass is in the form of a light sensitive reversal-development layer on a carrier.

Preferably the film former contains 30 to 70 percent by weight of a vinyl pyrrolidone-vinyl acetate copolymer and/or 30 to 70 percent by weight of a polyvinylpyrrolidone, and 70 to 30 percent by weight of an arylsulfonamide formaldehyde resin. In the vinyl pyrrolidone-vinyl acetate copolymer, the ratio between vinyl pyrrolidone and vinyl acetate is preferably between 70:30 and 20:80. Such copolymers within this ratio of components have favorable characteristics concerning the desired solubility in water and light sensitivity.

Dyestuffs and/or pigments are preferably added to the light-sensitive mass. Known compounds can be used as the sensitizers. Preferably a tanning diazo is used as the sensitizer in the light-sensitive mass. One or more light sensitizers can be used — for example, two or three.

This invention involves a process of preparing a light sensitive mass containing (a) a film former of 0 to 90 percent by weight of a vinyl pyrrolidone-vinyl acetate copolymer and/or 90 to 0 percent by weight of polyvinyl pyrrolidone and 10 to 80 percent by weight of an aryl-sulfonamide formaldehyde resin, and (b) at least one sensitizer, the weight ratio of the film former to the sensitizer being between 1:1 and 10:1, dissolved in (c) an organic solvent, to the carrier, and drying the light sensitive mass. After exposure, the exposed light sensitive mass can be developed using water or a solution containing water.

DETAILED DESCRIPTION OF THIS INVENTION

U.S. Pat. No. 3,547,645 teaches how to prepare aryl sulfoneamide formaldehyde resins.

Preferably the tanning diazo (preferred sensitizer) is a water insoluble diphenyl amino diazo formaldehyde condensate. The water insolubility can be achieved by the use of $-BF_4-$, molybdate, ferricyanate or wolframate groups — the $BF_4$ group is preferred. UV-hardenable short oil alkyd resins which contain a photo initiator for acid containing lacquers, which upon exposure to UV rays allows the hydrogen chloride or sulfonic acid to become effective (or active), can also be used as the sensitizer. Such products are, for example, known under the tradename Alkydal (sold by Bayer). Additional sensitizing compounds which can be used are 4,4'-diazidostilbene, 4,4'-diazidostilbene-2,2'-disulfonic acid, 4,4'-diazidostilbene-3,3'-disulfonic acids, phenyl diazo compounds (for examples, see German OS 2,208,389) and 1,3-diphenyl triazo compounds (for examples see British Pat. No. 1,325,974).

In order to increase the contrast of the developed copy and to increase the light-sensitivity of the layer, dyestuffs, and/or pigments can be added to (admixed in) the light sensitive mass. The dyestuffs or pigment also functions as an optical filter. Examples of useful dyestuffs and pigments are methyl violet, bleachable methylene blue, Victoria blue, Nile blue, emerald green, smaragd green or heliogen blue pigment paste. Inorganic substances (pigments and dyestuffs) with clear fluorescence are also suitable. Complex salt solutions in dimethyl sulfoxide of uranium compounds and furthermore erbium, didymium and lanthanum compounds which absorb UV rays of 230 to 280 nm and which reflect longer-wave, still invisible light of 260 to 420 nm, can be used. These wave lengths lie exactly in the range of the maximum diazo sensitivity. Fluoroescent organic substances, above all benzol derivatives, for example, anthracene, can be used.

As dyestuffs, one can also photochrome dyestuffs in order to increase the contrast of the copy — an example is orange colored triphenylfulgide, which in the case of UV exposure changes its shade into an intensive blue. In the case of a red exposure, the color again changes to orange. Colorless "spiranes", which in the case of UV exposure pass over into a very deep blue as a result of isomerization and which become colorless again in the case of daylight, are also suitable. Furthermore, derivatives of acid anilides, aldehyde hydrazones and fulgides can be used in this manner as well as derivatives of 2,3-dimethylsuccinic acid anhydride thioindigo, anthraquinone derivatives, etc. Also for transparent copies, for example, montage foils, the light sensitive mass of this invention can be used with success by using additionally fluorescent rubrene in order to increase the covering.

The light sensitive mass of this invention can contain a secondary dyestuff, which prevents the undesirable effect of cut edges in the case of printing plates, especially in the case of use of the light sensitive mass on a carrier. Suitable organic secondary dyestuffs are, for example, acridine orange, emerald green, brilliant sulvoflavin, fluorescein derivatives, geranine, thioflavin S, thiazo yellow, rhodamin, lumogene types and others. Further examples are eosin, silver eosin, erytrosin, Bengal rose, 4,4'-diaminostilbene-2,2'-disulfonic acid, derivatives of cumarin, dihydroquinolinol, 3-diaryl pyrazoline, naphthalic acid imide, benzoxazol-benzisoxazol- and benzimidazol-systems linked over CH=CH— bonds, dihydroxynaphthaldazine and dihydroxybenzaldazine.

Inorganic luminescent substances which are free of radioactive additives and known as Lenard phosphorus and other phosphorus compositions such as, sulfide-, selenide-, germanate-, tungstate-, borate-, vanadate-, aluminate- and halophosphate-phosphorus, are exceedingly effective. Furthermore, alcoholic quinone solutions, quinone lactate solutions or zinc salicylate can be used.

The dyestuff and/or pigment are used in a quantity between 0.1 and 2 percent by weight, related to the light sensitive mass.

The secondary dyestuff is used in a quantity between 0.1 and 6 percent by weight, related to the light sensitive mass.

The use of the light sensitive mass can be accomplished in the form of a light sensitive layer on a carrier, preferably in the form of printing plates.

The light sensitive mass is dissolved in an organic solvent(s) customarily used in lacquer chemistry. The selection of the solvent is not critical and one can use, for example, alcohols, glycol ether, ketones, ether, ester, dimethylformamide, dimethyl sulfoxide, etc., or mixtures thereof. The dissolved light sensitive mass can be applied to the carrier, for example, in any conventional or known manner, such as, painting dipping, rolling, brushing, spraying, centrifuging or electrostatic means. The carrier can be, for example, aluminum, granulated mechanically, chemically and/or oxidized zinc, phosphated zinc, copper, iron, copper and/or brass, oxilated multimetal plates with Cu, Cr or Ni surface, magnesium, hydrophilized plastic printing plates, mounting foils or plastic-metal printing plates.

The light sensitive mass applied to the carrier dries very quickly with little energy expenditure because of the use of organic solvents. As a result of the short drying time, incrustation from dust is also minimal. Changing temperatures and humidity of the air, and condensation water developing as a result of such, no longer lead to damage of the light sensitive layer.

The light sensitive mass of the invention is particularly suitable for reversing copying layers. In the case of exposure under a copy, the exposed places are cross-linked by tanning, as a result of which their solubility in water, and also in many organic solvents, diluted acids or salts solutions, decreases or is lost. The unexposed parts retain solubility and such uncross-linked parts of the layer are detached using water during developing. Preferably the exposed light sensitive mass is developed with water - but it is also possible to use alcohol-water mixtures or alcohol-water-acid mixtures to achieve development.

Printing plates treated in such a manner can either be lacquered or copper plated additively, whereby the light hardened layer can be removed with water and a brush. In the case of multimetal plates where Cr or Ni layers are to be etched through the cooper, the layer will bear all so-called biological etchings or electrolytic removal by etching either with little or free of $ZnCl_2$ in chromic acid-electrolyte with lead electrode. Cu-Al bimetal plates can be processed chemically or electrochemically. After developing, one will obtain a negatively differentiated pattern, where, as has already been described, printing elements are fixed by lacquering or copper plating by eating through. After this fixation, the pattern is no longer necessary, or even a disturbing factor in printing, can be removed with water and light brushing. The nonprinting surfaces which have been cleared, are secondarily processed in a hydrophilizing manner — then, as customary, the plate is sized (gummed), dried and made ready for printing.

With the light sensitive masses of this invention, one can produce printing and etching plates or cylinder and transparent mounting foils suitable for printing forms for offset printing, book printing, half-turn photogravue and silk screen printing, as well as in the electronic industry for the production of printed and integrated circuits, transistors, etc., and the production of signs (posters).

To recap, this invention involves a light sensitive mass which contains (a) a film former, which consists of 20 to 90 percent by weight of vinylpyrrolidone-vinyl acetate copolymer or a polyvinyl pyrrolidone or both, and 10 to 80 percent by weight of an aryl sulfone amide formaldehyde resin, and (b) at least one sensitizer, the weight ratio of said film former to sensitizer being between 1:1 and 10:1. Preferably the light sensitive mass is as a light sensitive reversal-development layer on a carrier. This invention also includes a process for the production of a light-sensitive mass which comprises applying said light sensitive mass containing (a) a film former, which consists of 20 to 90 percent by weight of a vinyl pyrrolidone-vinyl acetate copolymer or a polyvinyl pyrrolidone or both and 10 to 80 percent by weight of an aryl sulfone amide formaldehyde resin, and (b) at least one sensitizer, the weight ratio of said film former to the sensitizer being between 1:1 and 10:1, dissolved in (c) an organic solvent, to a carrier, and drying the light sensitizer mass applied to the carrier. Preferably the light sensitive mass is used as a light sensitive reversal-development layer on a carrier. After exposure, the exposed light sensitive mass can be developed using water or a water-containing solution.

As used herein, ratios and percentages are on a weight basis unless otherwise stated herein or otherwise obvious herefrom to one ordinarily skilled in the art.

EXAMPLE 1

50 gm. of aryl-sulfonamide-formaldehyde resin and 100 gm. of polyvinyl pyrrolidone are dissolved in 100 gm. of ethanol. The mixture was then mixed with 150 gm. of UV-hardenable, short oil alkyl resin (60% in isobutanol/xylene) and 1000 gm. of isobutanol/ xylene 9:1 as well as 6 gm. of triphenylfulgide, as a secondary dyestuff. At the same time dyestuff is mixed in homogenously. The light sensitive mass is applied to a copper-aluminum bimetal plate according to a customary process in a quantity of 2 to 4 gm./m². The light sensitive mass (plate) is dried for 1 minute at 100° C. The plate can be stored and after any length of time can be exposed under UV light, for example, under a negative. The exposed plate can subsequently be developed under a jet of water and with a tampon. After developing and without being dried first, it can immediately be etched away with an Fe-containing etching copper from the non-printing places. It can also be decoppered by the Elfers process or electronically in a cuvette. Subsequently, it is de-layered with water and the non-printing surface is hydrophilized.

EXAMPLE 2

200 gm, of vinyl-vinylpyrrolidone-vinyl acetate copolymer (50% in ethanol), 100 gm. of aryl sulfonamide formaldehyde resin and 2000 gm. of ethanol are mixed with 30 gm of diazo-formaldehyde condensate-BF$_4$, 300 gm. of dimethyl formamide, 1 gm. of quinone in 100 ml of ethanol (as the secondary dyestuff and 3 gm. of Victoria blue as the dyestuff). The light-sensitive mass is applied in the customary manner to a chromiumcopper multimetal plate an amount of 1 to 3 gm/m$^2$. The plate is dried at 100° C. The storable plate is then exposed under a positive copy under UV light and subsequently developed with a jet of water and a tampon. Intermediate drying is carried out for corrections and for spotting out. The chromium layer can be etched through to the copper with the customary chromium etchings. After etching, it can immediately be de-layered using only water and a brush. As in Example 1, rehardening of the layer prior to etching is not necessary.

EXAMPLE 3

200 gm of vinylpyrrolidone-vinyl acetate copolymer, 100 gm of aryl sulfonamide formaldehyde resin, 100 gm, of polyvinyl pyrrolidone and 100 gm of 1,3-di-p-tolyl-3-methyl triazene (as the sensitizer) are dissolved in 500 gm of dimethyl formamide, 1500 gm. of methyl cellosolve acetate and 1500 gm of ethanol - while adding 4 gm of methyl violet as the dye and 1 gm of DMSO complexed uranyl nitrate (as the secondary dyestuff). The light-sensitive mass is applied in a quantity of 2 gm/m$^2$ on anodically oxidized aluminum, and then dried. After exposure under a diapositive, it is developed with water and tampon, intermediate-dried for spotting out and for corrections, and subsequently lacquered with known printing style lacquers. After drying of the lacquer, some protective color is rubbed in and it is again de-layered without auxiliary means, using only water and a brush.

EXAMPLE 4

100 gm of aryl-sulfonamide formaldehyde resin, 200 gm. of vinyl pyrrolidone-vinyl acetate copolymer, 50 gm. of polyvinyl pyrrolidone, 50 gm of UV hardening, short oil alkyd resin (70% in isopropanol/xylene), 300 gm of isopropanol/xylene 8:2, 5 gm of rhodamin and 2 gm of silver eosine are dissolved along with 100 gm of 2,6-dibromoquinone-(1,4)-diazide-(4) in 500 gm of methyl cellosolve acetate. The admixture is mixed into a homogenous light-sensitive mass. The light sensitive mass is applied to an anodically oxidized aluminum plate in a quantity of 2 g/m$^2$ and dried. After storage, it is exposed under a diapositive, developed with water and a tampon, and is copper-plated without necessary corrections and intermediate drying, additively and electrolytically with a tampon. It is quite possible to copper-plate the plate in the cuvette, to nickle-plate it reductively and/or catalytically, whereby the layer of nickel can be activated for the absorption of fatty acid, just like copper.

What is claimed is:

1. A process for the production of a light-sensitive material which comprises applying a light sensitive composition containing (a) a film former, which consists of 20 to 90 percent by weight of a vinyl pyrrolidone-vinyl acetate copolymer or a polyvinyl pyrrolidone or both and 10 to 80 percent by weight of an aryl sulfone amide formaldehyde resin, and (b) at least one sensitizer, the weight ratio of said film former to said sensitizer being between 1:1 and 10:1, said sensitizer being selected from the group consisting of a tanning diazo compound, a phenyl diazo compound, a 1,3-diphenyl triazo compound, 4,4'-diazidostilbene, 4,4'-diazidostilbene-2,2'- disulfonic acid, 4,4'-diazidostilbene-3,3'-disulfonic acid, a UV-hardenable short oil alkyd resin and 1,3-di-p-tolyl-3-methyl triazene, and said sensitizer being dissolved in (c) an organic solvent, to a carrier in the form of a layer, and drying said light sensitive layer applied to said carrier.

2. A process as claimed in claim 1 wherein said sensitizer is 1,3-di-p-tolyl-3-methyl triazene.

3. A process as claimed in claim 1 wherein said tanning diazo is a water insoluble diphenyl amino diazo formaldehyde condensate.

4. A process as claimed in claim 3 wherein said water insolubility of said water insoluble diphenzl amino diazo formaldehyde condensate containing a —BF$_4$, a molybdate group, a ferricynate group or wolframate group.

5. A process as claimed in claim 4 wherein said water insoluble diphenyl amino diazo formaldehyde condensate containing a BF$_4$.

6. A process as claimed in claim 1 wherein said sensitizer is a UV-hardenable short oil alkyl resin.

7. A process as claimed in claim 1 wherein said sensitizer is a UV-hardenable, short oil alkyd resin, which contains a photoinitiator.

8. A process as claimed in claim 1 wherein said dried light sensitive layer is exposed to ultraviolet light in an image-wise manner and then is developed using water or a water-containing solution by removing the unexposed areas.

9. A process as claimed in claim 1 wherein said film former consists of 30 to 70 percent by weight of a vinyl pyrrolidone-vinyl acetate copolymer or a polyvinyl pyrrolidone or both and 30 to 70 percent by weight of an aryl sulfone amide formaldehyde resin.

10. A process as claimed in claim 1 wherein a dyestuff or pigment or both included in said light sensitive layer.

11. A process as claimed in claim 10 wherein said dyestuff or pigment or both are present in said light sensitive layer in a quantity of 0.1 to 2 percent by weight, based on the total weight of said light sensitive layer.

12. A process as claimed in claim 1 wherein a secondary dyestuff is included in said light sensitive layer.

13. A process as claimed in claim 12 wherein a secondary dyestuff is present in said light sensitive layer in a quantity of 0.1 to 6 percent by weight, based on the total weight of said light sensitive layer.

14. A process as claimed in claim 13 wherein said secondary dyestuff is selected from the group consisting of acridine orange, emerald green, brilliant sulvoflavin, a fluorescein, gernanine, thioflavin S, thiazo yellow, rhodamin, a lumogene, eosin, silver eosin, erythrosin, Bengal rose, 4,4'-diaminostilbene-2,2'-disulfonic acid, a cumarin, dihydroquinolinol, 3-diaryl pyrazolin, naphthalic acid imide, a benzoxazol, benzisoxazol- or benzimidazol-system linked by CH=CH—bonds, dihydroxynaphthaldazine, dihydroxybenzaldazine, an alcoholic quinone solution, a quinone lactate solution and zinc salicylate.

15. A light sensitive composition which contains (a) a film former, which consists of 20 to 90 percent by weight of vinylpyrrolidone- vinyl acetate copolymer or a polyvinyl pyrrolidone or both and 10 to 80 percent by weight of an aryl sulfone amide formaldehyde resin, and at least one sensitizer, the weight ratio of said film former to sensitizer being between 1:1 and 10:1, and said sensitizer being selected from the group consisting of a tanning diazo compound, a phenyl diazo compound, a 1,3-diphenyl triazo compound, 4,4'-diazidostilbene, 4,4'-diazidostilbene-2,2'-disulfonic acid, 4,4'-diazidostilbene-3,3'-disulfonic acid, a UV-hardenable short oil alkyd resin and 1,3-di-p-tolyl-3-methyl triazene.

16. A light sensitive composition as claimed in claim 15 wherein said sensitizer is 1,3-di-p-tolyl-3-methyl triazene.

17. A light sensitive composition as claimed in claim 15 wherein said tanning diazo is a water insoluble diphenyl amino diazo formaldehyde condensate.

18. A light sensitive composition as claimed in claim 15 wherein said water insolubility of said water insoluble diphenyl amino diazo formaldehyde condensate containing-$BF_4$, a molybdate group, a ferricynate group or wolframate group.

19. A light sensitive composition as claimed in claim 18 wherein said water insoluble diphenyl amino diazo formaldehyde condensate containing a $BF_4$.

20. A light sensitive mass as claimed in claim 15 wherein said sensitizer is a UV-hardenable short oil alkyl resin.

21. A light sensitive composition as claimed in claim 15 wherein said sensitizer is a UV-hardenable, short oil alkyd resin, which contains a photo-initiator.

22. A light sensitive composition as claimed in claim 15 is in the form of a layer on a carrier.

23. A light sensitive composition as claimed in claim 22 wherein said film former consists of 30 to 70 percent by weight of a vinylpyrrolidone vinyl acetate copolymer or a polyvinyl pyrrolidone or both and 30 to 70 percent by weight of an aryl-sulfone amide formaldehyde resin.

24. A light sensitive composition as claimed in claim 22 wherein said light sensitive composition contains a dyestuff or a pigment or both.

25. A light sensitive composition as claimed in claim 23 wherein said light sensitive mass contains said dyestuff or pigment or both in a quantity of 0.1 to 2 percent by weight, based on the total weight of said light sensitive composition.

26. A light sensitive composition as claimed in claim 22 wherein said light sensitive mass contains a secondary dyestuff.

27. A light sensitive composition as claimed in claim 25 wherein said light sensitive mass contains a secondary dyestuff in a quantity of 0.1 to 6 percent by weight, based on the total weight of said light sensitive composition.

28. A light sensitive composition as claimed in claim 27 wherein said secondary dyestuff is selected from the group consisting of acridine orange, emerald green, brilliant sulvoflavin, a fluorescein, geranine, thioflavin S, thiazo yellow, rhodamin, a lumogene, eosin, silver eosin, erythrosin, Bengal rose, 4,4'-diaminostilbene-2,2'-disulfonic acid, a cumarin, dihydroquinolinol, 3-diaryl pyrazolin, naphthalic acid imide, a benzoxazol, benzisoxazol- or benzimidazol-system linked by CH=CH—bonds, dihydroxynaphthaldazine, dihydroxybenzaldazine, and alcoholic quinone solution, a quinone lactate solution and zinc salicylate.

* * * * *